US008390050B2

(12) United States Patent
Hirai

(10) Patent No.: US 8,390,050 B2
(45) Date of Patent: Mar. 5, 2013

(54) SEMICONDUCTOR DEVICE AND METHOD OF MANUFACTURING THE SAME

(75) Inventor: Tomohiro Hirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 306 days.

(21) Appl. No.: 12/823,574

(22) Filed: Jun. 25, 2010

(65) Prior Publication Data
US 2011/0024845 A1    Feb. 3, 2011

(30) Foreign Application Priority Data
Jul. 28, 2009   (JP) ................... 2009-175192

(51) Int. Cl.
| H01L 29/788 | (2006.01) |
| H01L 29/423 | (2006.01) |
| H01L 21/28 | (2006.01) |
| H01L 21/336 | (2006.01) |

(52) U.S. Cl. ............... 257/316; 257/369; 257/E29.129; 257/E29.3; 257/E21.179; 438/199; 438/211

(58) Field of Classification Search ............... 257/316, 257/369, E29.129, E29.3, E21.179; 438/199, 438/211
See application file for complete search history.

(56) References Cited

U.S. PATENT DOCUMENTS
| 2007/0215929 A1* | 9/2007 | Yasuda ................... 257/314 |
| 2010/0270604 A1* | 10/2010 | Lin et al. ................ 257/315 |
| 2010/0301406 A1* | 12/2010 | Ahn et al. ............... 257/324 |

FOREIGN PATENT DOCUMENTS
JP          2007-208260         8/2007

* cited by examiner

Primary Examiner — Victor A Mandala
(74) Attorney, Agent, or Firm — Young & Thompson

(57) ABSTRACT

A semiconductor device has a first-conductivity-type-channel MOSFET formed on a semiconductor substrate, wherein the first-conductivity-type-channel MOSFET is typically a P-channel MOSFET, and is composed of a gate insulating film and a gate electrode provided over the semiconductor substrate, the gate electrode contains a metal gate electrode provided over the gate insulating film, a metal oxide film provided over the metal gate electrode, and another metal gate electrode provided over metal oxide film.

22 Claims, 6 Drawing Sheets

SEMICONDUCTOR DEVICE AND METHOD OF MANUFACTURING THE SAME

This application is based on Japanese patent application No. 2009-175192 the content of which is incorporated hereinto by reference.

BACKGROUND

1. Technical Field

The present invention relates to a semiconductor device and a method of manufacturing the same.

2. Background Art

With recent advancement in shrinkage of LSI, degradation in operation current due to depletion of polysilicon gate electrode, which composes MOSFET (Metal-Oxide Semiconductor Field Effect Transistor), has been becoming increasingly problematic. Investigations have, therefore, been made on techniques of avoiding depletion of the electrode, by using metal gate electrodes.

As a MOSFET making use of a metal gate electrode and a high-k insulating film, there has been known a structure having a gate insulating film, a metal gate electrode, and a polysilicon gate electrode stacked on a semiconductor substrate. One exemplary MOSFET making use of such structure is described in Japanese Laid-Open Patent Publication No. 2007-208260. An N-channel MOSFET described in the cited patent publication has a gate insulating film which is configured by a $SiO_2$ film formed over a semiconductor substrate and a high-k insulating film stacked thereon, and a gate electrode which is configured by a lower electro-conductive film and an upper electro-conductive film typically composed of polysilicon stacked thereon. On the other hand, a P-channel MOSFET has a gate insulating film which is configured by a $SiO_2$ film formed over the semiconductor substrate and a high-k insulating film stacked thereon, and a gate electrode which is configured by a lower electro-conductive film, an insulating film, an intermediate electro-conductive film, and an upper electro-conductive film typically composed of polysilicon stacked in this order. Materials composing the lower electro-conductive film are exemplified by metals such as Ti, Al and Ta, and metal nitrides such as TiN. Materials composing the insulating film are exemplified by silicon oxide film, silicon nitride film, and metal nitride films typically composed of Al, La and Y. Materials composing the intermediate electro-conductive film are exemplified by metals such as Ti, Al and Ta, and metal nitrides such as TiN. According to the description, by virtue of this configuration, the work functions of the N-channel MOSFET and the P-channel MOSFET may independently be controllable.

SUMMARY

The configuration disclosed in Japanese Laid-Open Patent Publication No. 2007-208260 has, however, been suffering from a problem in that the material composing the intermediate electro-conductive film in the P-channel MOSFET may chemically react with the insulating film to thereby produce some other substance, or in that the work function of the P-channel MOSFET cannot fully be controllable due to diffusion of the material composing the intermediate electorconductive film through the insulating film into the lower electro-conductive film, and therefore the threshold voltage may fluctuate.

For an exemplary case where TiN is used for the lower electro-conductive film, $SiO_2$ is used for the insulating film, and TiN is used for the intermediate electro-conductive film, $SiO_2$ which composes the insulating film may chemically react with the upper and lower electro-conductive films, and may change itself into $TiO_2$. For this reason, control of the threshold voltage of the P-channel MOSFET may be destabilized.

In addition, for an exemplary case where Al is used for the lower electro-conductive film, $SiO_2$ is used for the insulating film, and TiN is used for the intermediate electro-conductive film, Ti contained in the intermediate electro-conductive film may diffuse into Al which composes the lower electro-conductive film after migrating through the insulating film, so that the work function of the P-channel MOSFET cannot fully be controllable, and therefore the threshold voltage may fluctuate.

A similar problem may occur also when metal nitride is used for the insulating film. A similar problem may occur not only in the P-channel MOSFET, but also in the N-channel MOSFET.

According to the present invention, there is provided a semiconductor device having a semiconductor substrate and a first-conductivity-type-channel MOSFET formed thereon, which includes:

a first gate insulating film provided over the semiconductor substrate;

a first metal gate electrode provided over the first gate insulating film;

a metal oxide film provided over the first metal gate electrode; and a second metal gate electrode provided over the metal oxide film.

According to the present invention, there is also provided a method of manufacturing a semiconductor device, which includes:

forming a gate insulating film over a semiconductor substrate;

forming a first metal gate electrode layer over the gate insulating film;

forming a metal oxide film over the first gate electrode layer; and forming a second metal gate electrode layer over the metal oxide film.

According to the present invention, there is still also provided a method of manufacturing a semiconductor device having a semiconductor substrate, and a first-conductivity-type-channel MOSFET and a second-conductivity-type-channel MOSFET provided on said semiconductor substrate, said method comprising:

forming a first gate insulating film and a second gate insulating film over said semiconductor substrate in a first-conductivity-type-channel MOSFET forming region and a second-conductivity-type-channel MOSFET forming region, respectively;

forming a first metal gate electrode layer over said first gate insulating film;

forming a metal oxide film respectively over said first metal gate electrode layer and said second gate insulating film; and forming a second metal gate electrode film over said metal oxide film in said first-conductivity-type-channel MOSFET forming region, and forming a third metal gate electrode film over said metal oxide film in said second-conductivity-type-channel MOSFET forming region.

Metal oxide has a standard enthalpy of formation lower than those of silicon oxide and metal nitride, and is therefore thermally stable. Since the metal oxide film is provided between the first metal gate electrode and the second metal gate electrode in the above-described configuration, metal atoms which compose the second metal gate electrode may be prevented from diffusing into the first metal gate electrode, while suppressing the chemical reaction which may otherwise proceed between the metal oxide film and each of the upper and lower metal gate electrodes. Accordingly, the work function of MOSFET which has the metal gate electrode may fully be controllable, and thereby the semiconductor device successfully suppressed in variation in the threshold voltage, and a method of manufacturing such semiconductor device can be provided.

According to the present invention, a semiconductor device excellent in controllability of the threshold voltage, and a method of manufacturing the same may be provided.

BRIEF DESCRIPTION OF THE DRAWINGS

The above and other objects, advantages and features of the present invention will be more apparent from the following description of a certain preferred embodiment taken in conjunction with the accompanying drawings, in which.

DETAILED DESCRIPTION

Figure 1:
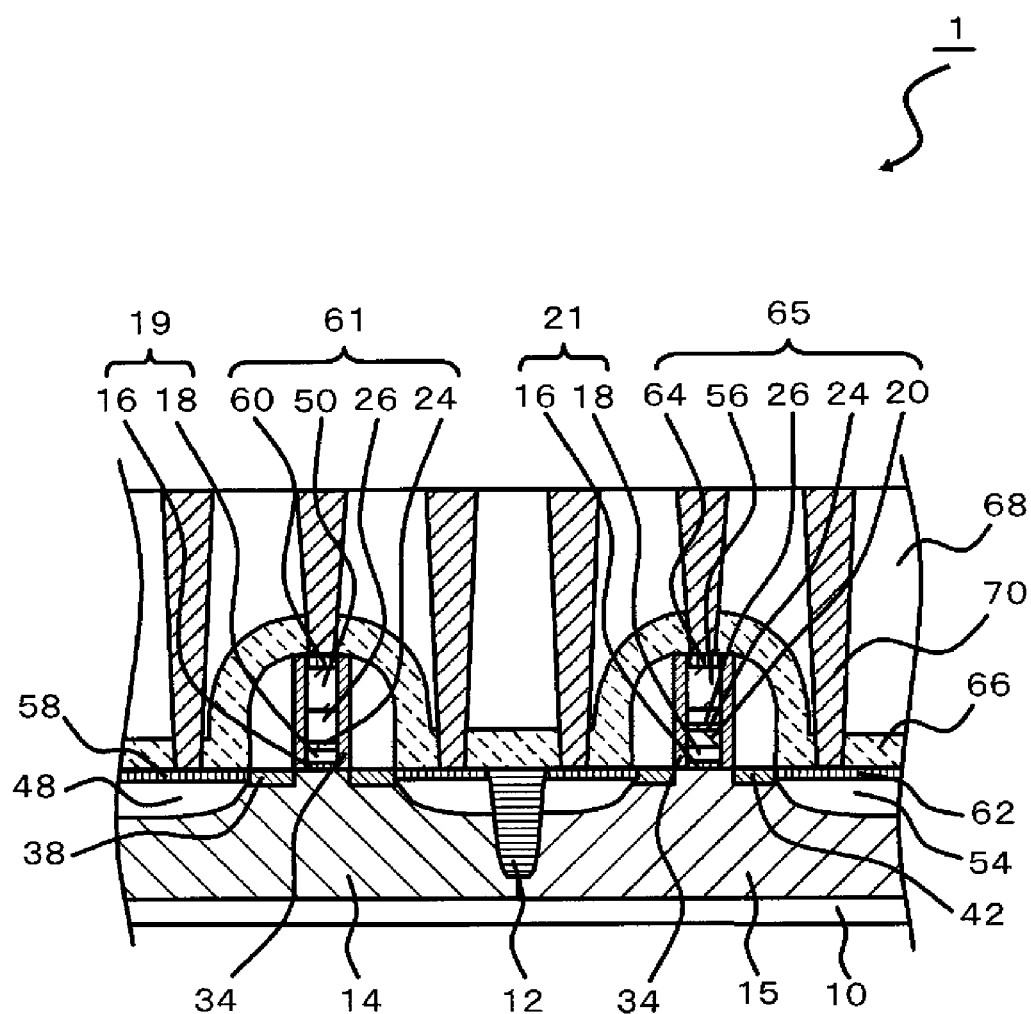
FIG. 1 is a sectional view illustrating a semiconductor device of an embodiment of the present invention.

The invention will now be described herein with reference to an illustrative embodiment. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that all similar constituents in all drawings will be given similar reference numerals or symbols, and explanations therefor will not always necessarily be repeated.

FIG. 1 is a sectional view illustrating a semiconductor device 1 in this embodiment. The semiconductor device 1 has a P-channel MOSFET (first-conductivity-type-channel MOSFET) and an N-channel MOSFET (second-conductivity-type-channel MOSFET), formed on a semiconductor substrate 10.

The P-channel MOSFET has a gate insulating film 21 (first gate insulating film) provided over the semiconductor substrate 10 (silicon substrate), a metal gate electrode 20 (first metal gate electrode) provided over the gate insulating film 21, a metal oxide film 24 provided over the metal gate electrode 20, and a metal gate electrode 26 (second metal gate electrode) provided over the metal oxide film 24.

For the metal oxide film 24, a material selected from $La_2O_3$, $Al_2O_3$, $Ta_2O_5$, $ZrO_2$ and $HfO_2$ may be used. This embodiment exemplifies the case where $La_2O_3$ is used.

The thickness of the metal oxide film 24 is not specifically limited, and may typically be not less than 0.1 nm but not more than 10.0 nm. By adjusting the thickness in this range, characteristics of the MOSFET may be prevented from being degraded, even if metal oxide film 24 resides in a gate electrode 65.

The gate insulating film 21 is composed of an interfacial insulating film 16 (silicon oxynitride film), and a high-k film 18 having a dielectric constant larger than that of the interfacial insulating film 16. As the interfacial insulating film 16, silicon oxynitride film, silicon oxide film, silicon nitride film and so forth can be used. For the high-k film 18, HfSiON, $HfO_2$, $ZrO_2$ and so forth may be used. The gate insulating film 21 may have a multi-layered structure, or may alternatively have a single-layered structure (high-k film 18), without limitation.

The gate electrode 65 of the P-channel MOSFET is configured by a stacked film composed of the metal gate electrode 20, the metal oxide film 24, the metal gate electrode 26, a silicon electrode 56, and a silicide layer.

For the metal gate electrode 20, Al, TiN, W, TaN, TaSiN, Ru, TiAl and so forth, for example, may be used. For the metal gate electrode 26, TiN, W, TaN, TaSiN, Ru, TiAl and Al, for example, may be used.

The material composing the metal gate electrode 20 and the metal gate electrode 26 may be same or different. This embodiment deals with an exemplary case where Al is used for the metal gate electrode 20, and TiN for the metal gate electrode 26.

The N-channel MOSFET contains a gate insulating film 19 (second gate insulating film) provided over the semiconductor substrate 10, and the metal gate electrode 26 (third gate insulating film) provided over the gate insulating film 19. The N-channel MOSFET additionally has the metal oxide film 24 provided between the gate insulating film 19 and the metal gate electrode 26.

As the metal oxide film 24, a material selected from $La_2O_3$, $Al_2O_3$, $Ta_2O_5$, $ZrO_2$ and $HfO_2$ can be used. This embodiment deals with an exemplary case where $La_2O_3$ is used. The thickness of the metal oxide film 24 may be not less than 0.1 nm but not more than 10.0 nm, for example, similarly to the thickness of the metal oxide film 24 of the P-channel MOSFET.

The gate insulating film 19 is composed of the interfacial insulating film 16 (silicon oxynitride film), and the high-k film 18 having a dielectric constant larger than that of the interfacial insulating film 16. As the interfacial insulating film 16, silicon oxynitride film, silicon oxide film, silicon nitride film and so forth, for example, may be used. As the high-k film 18, HfSiON, $HfO_2$, $ZrO_2$ and so forth, for example, may be used. This embodiment deals with an exemplary case where $HfO_2$ is used. The gate insulating film 19 may have a multi-layered structure, or may have a single-layered structure (high-k film 18), without limitation.

A gate electrode 61 of the N-channel MOSFET is configured by a stacked film composed of the metal oxide film 24, the metal gate electrode 26, a silicon electrode 50, and a silicide layer 60.

As the metal gate electrode 26, TiN, W, TaN, TaSiN, Ru, TiAl and Al, for example, can be used. This embodiment deals with an exemplary case where TiN is used for the metal gate electrode 26.

In the N-channel MOSFET, the metal oxide film 24 may be provided, but it is not always necessary. However, as described later, also control of the threshold voltage may become controllable, by providing the metal oxide film 24 composed of $La_2O_3$, between the high-k film 18 and the metal gate electrode 26 in the N-channel MOSFET. For this reason, better characteristics of the semiconductor device 1 as a whole may be obtained, by providing the metal oxide film 24 also to the N-channel MOSFET.

Next, a method of manufacturing a semiconductor device according to one embodiment of the present invention will be explained referring to FIGS. 2A to 2D, FIGS. 3A to 3D, FIGS. 4A to 4D, FIGS. 5A to 5D, and FIGS. 6A to 6D.

The method of manufacturing a semiconductor device of this embodiment includes forming a gate insulating film (the gate insulating film 21) over the semiconductor substrate 10 (silicon substrate), forming a first metal gate electrode layer (the metal gate electrode 20) over the gate insulating film 21, forming the metal oxide film 24 over the metal gate electrode 20, forming a second metal gate electrode layer (the metal gate electrode 26) over the metal oxide film 24.

For an exemplary case where a first-conductivity-type-channel MOSFET and a second-conductivity-type-channel MOSFET are provided on the semiconductor substrate 1, the method of manufacturing a semiconductor device of this embodiment includes a step of forming a first gate insulating film (gate insulating film 21) and a second gate insulating film (gate insulating film 19) over the semiconductor substrate 10 in a first region (first-conductivity-type-channel MOSFET forming region) and a second region (second-conductivity-type-channel MOSFET forming region), respectively; a step of forming a first metal gate electrode layer (metal gate electrode 20) over the gate insulating film 21; a step of forming a metal oxide film (metal oxide film 24) respectively over the metal gate electrode 20 and the gate insulating film 19; and a step of forming a second metal gate electrode film (metal gate electrode 26) over the metal oxide film 24 in the first-conductivity-type-channel MOSFET forming region, and forming a third metal gate electrode film (metal gate electrode 26) over the metal oxide film 24 in the second-conductivity-type-channel MOSFET forming region.

Figure 2A:
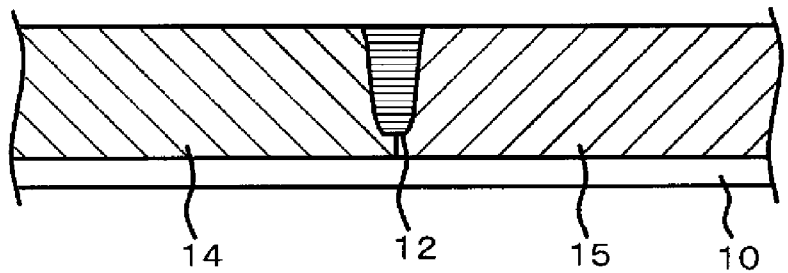
FIGS. 2A to 2D, FIGS. 3A to 3D, FIGS. 4A to 4D, FIGS. 5A to 5D, and FIGS. 6A to 6D are sectional views illustrating steps of manufacturing the semiconductor device in the embodiment of the present invention.
Figure 2B:
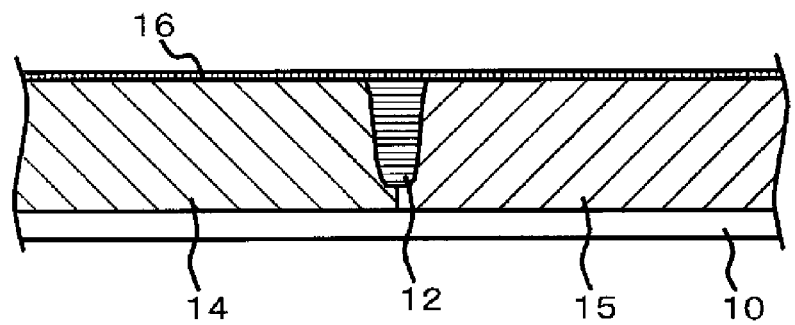

First, as illustrated in FIG. 2A, a device isolation oxide film 12 is formed in the surficial portion of the semiconductor substrate 10, by a conventionally known method called STI (Shallow Trench Isolation). A P-well 14 and an N-well 15 are then formed in the N-channel MOSFET forming region and the P-channel MOSFET a forming region, respectively. A silicon oxynitride film having a thickness of 1.0 nm is then formed as the interfacial insulating film 16, in the N-channel MOSFET forming region and the P-channel MOSFET forming region (FIG. 2B). The method of formation adopted herein is such as forming a silicon oxide film typically by using a sulfuric acid/hydrogen peroxide mixed solution, ozone water, hydrochloric acid/ozone water, or by oxidation, followed by plasma nitriding.

Figure 2C:
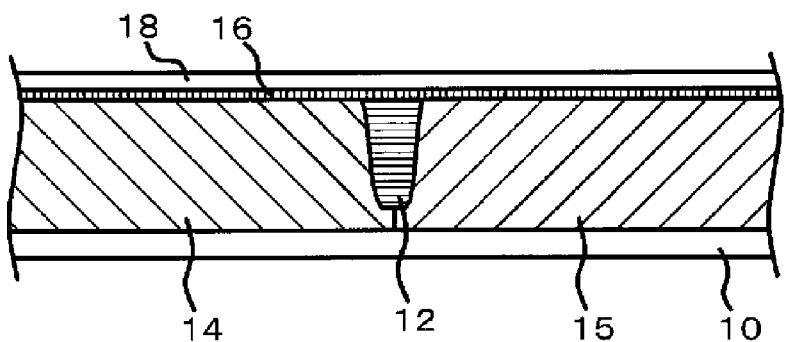

Then as illustrated in FIG. 2C, the high-k film 18 is formed over the interfacial insulating film 16. The high-k film 18 is an insulating film composed of a material selected from HfSiON, $HfO_2$ and $ZrO_2$. In this embodiment, $HfO_2$ film was used. The thickness of the high-k film 18 is typically not less than 1.0 nm but not more than 5.0 nm. As a method of forming, CVD, ALCVD, sputtering and so forth may be adoptable.

Figure 2D:
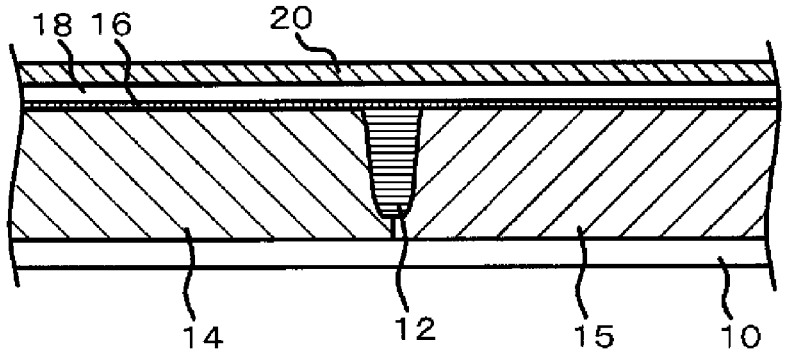

Next, as illustrated in FIG. 2D, the metal gate electrode 20 is formed over the entire surface of the high-k film 18 in the N-channel MOSFET forming region and the P-channel MOSFET forming region. The metal gate electrode 20 is composed of a metal selected from Al, TiN, W, TaN, TaSiN, Ru and TiAl. In this embodiment, Al was used. The thickness of the metal gate electrode 20 is typically not less than 1.0 nm but not more than 20.0 nm.

Figure 3A:
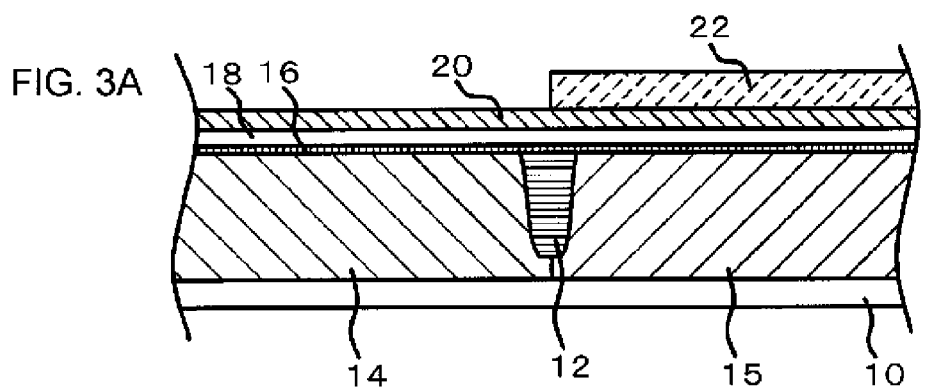

Next, a resist film is formed so as to cover the entire surface of the metal gate electrode 20, and is then locally removed as illustrated in FIG. 3A in the N-channel MOSFET forming region, to thereby expose the metal gate electrode 20 in the N-channel MOSFET forming region. A resist mask 22 is thus formed (FIG. 3A).

Figure 3B:
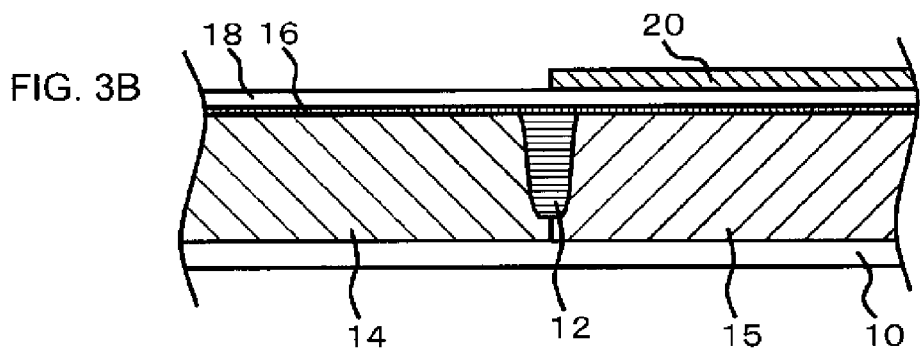

Next, the metal gate electrode 20 is selectively removed in the N-channel MOSFET forming region. In this way, an opening is formed in the metal gate electrode 20 in the N-channel MOSFET forming region. The removal may be carried out by wet etching using a $H_2O_2$ solution, or by dry etching. The resist mask 22 is then removed by a wet process using an organic remover liquid (FIG. 3B). In place of using the organic remover liquid, the removal of the resist mask 22 may alternatively be carried out by oxygen plasma ashing, $H_2/N_2$ ashing and so forth.

Figure 3C:
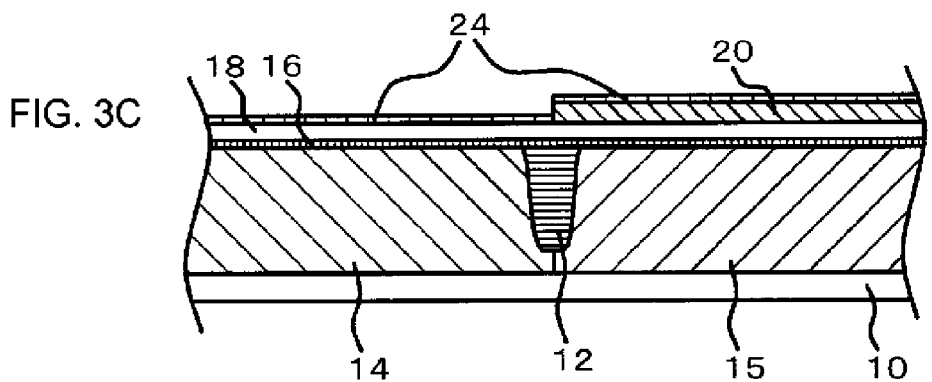

Next, as illustrated in FIG. 3C, the metal oxide film 24 is formed. The metal oxide film 24 may be composed of a material selected from $La_2O_3$, $Al_2O_3$, $Ta_2O_5$, $ZrO_2$ and $HfO_2$. In this embodiment, $La_2O_3$ was used. The thickness of the metal oxide film 24 may typically fall in the range from 0.1 nm to 10.0 nm. The metal oxide film 24 may be formed by CVD, ALCVD, sputtering and so forth.

Next, the metal gate electrode 26 is formed so as to cover the entire surface of the metal oxide film 24. The metal gate electrode 26 may typically be composed of a material selected from TiN, W, TaN, TaSiN, Ru, TiAl and Al. In this embodiment, TiN was used for the metal gate electrode 26.

Next, a silicon electrode 28 is formed over the metal gate electrode 26. The silicon electrode 28 is composed of amorphous silicon. The silicon electrode 28 (amorphous silicon) may have a thickness of not less than 10 nm but not more than 100 nm, for example. Besides amorphous silicon, polysilicon may be adoptable to the silicon electrode 28.

Figure 3D:
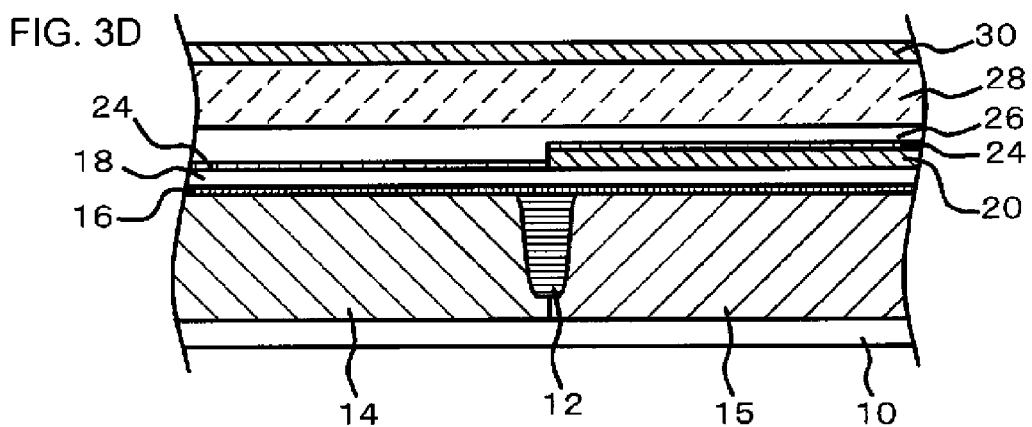

A hard mask 30 is then formed. The hard mask 30 is a film composed of either silicon oxide film or silicon nitride film (FIG. 3D).

Figure 4A:
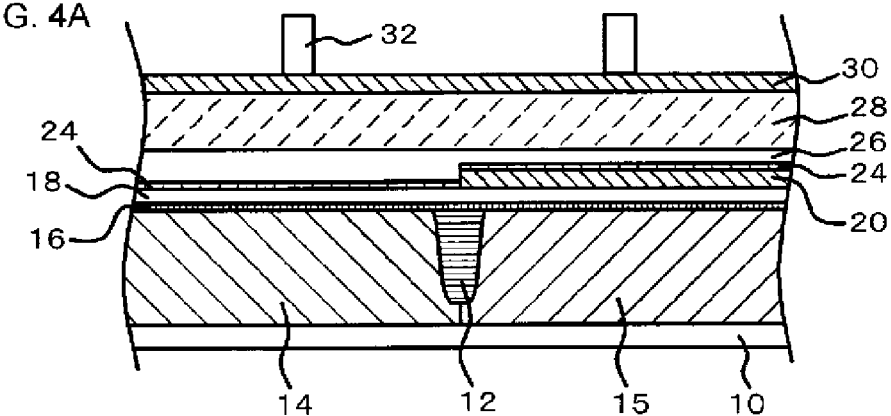

Next, as illustrated in FIG. 4A, a resist mask 32 is formed in the gate electrodes forming region, in the N-channel MOSFET forming region (P well 14) and in the P-channel MOSFET forming region (N well 15).

Figure 4B:
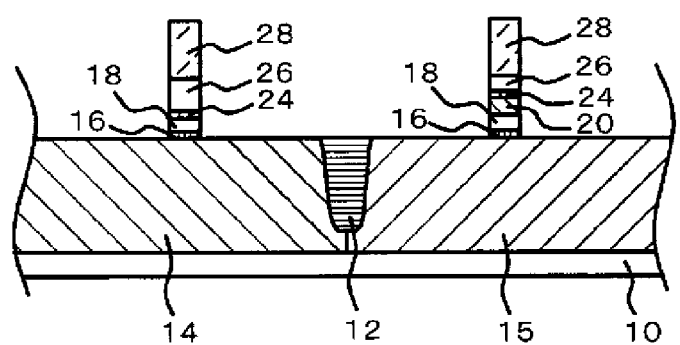

Next, as illustrated in FIG. 4B, the gate insulating film and the gate electrode are patterned by dry etching and wet process, to thereby obtain a gate geometry. The hard mask 30 is then removed, as illustrated in FIG. 4B.

Figure 4C:
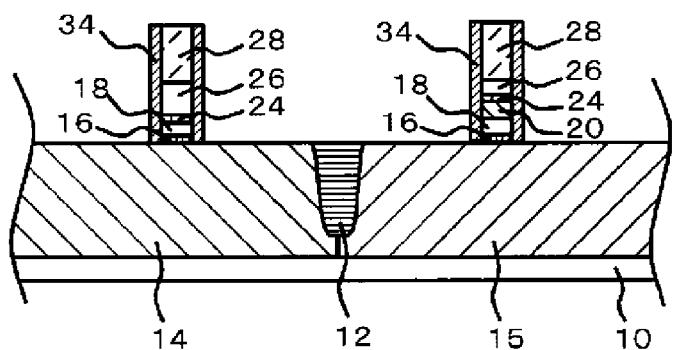

A silicon nitride film is then formed by ALCVD, and as illustrated in FIG. 4C, offset spacers 34 are formed. The film composing the offset spacer may be a silicon oxide film, or may have a stacked structure of silicon nitride film and silicon oxide film.

Figure 4D:
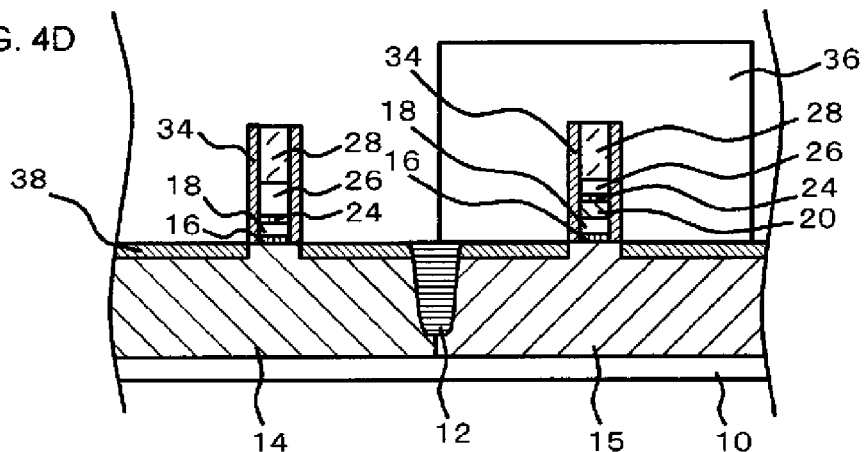
Figure 5A:
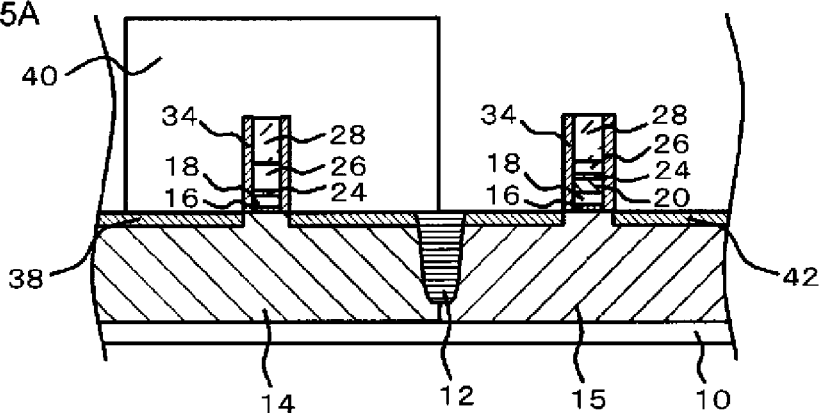

Extension regions 38 are then formed by ion implantation into the N-channel MOSFET forming region, while masking the P-channel MOSFET forming region with a resist mask 36 (FIG. 4D). Conditions for the implantation include an ion species of As, an acceleration energy of 2 keV, a dose of 8E14 atoms/cm$^2$, an angle of implantation of 0°; and an ion species of $BF_2$, an acceleration energy of 50 keV, a dose of 3E13 atoms/cm$^2$, and an angle of implantation of 30°. Next, extension regions 42 are formed by ion implantation into the P-channel MOSFET forming region, while similarly masking the N-channel MOSFET forming region with a resist mask 40 (FIG. 5A). Conditions for the implantation include an ion species of $BF_2$, an acceleration energy of 3 keV, a dose of 8E14 atoms/cm$^2$, an angle of implantation of 0°; and an ion species of As, an acceleration energy of 50 keV, a dose of 3E13 atoms/cm$^2$, and an angle of implantation of 30°.

Figure 5B:
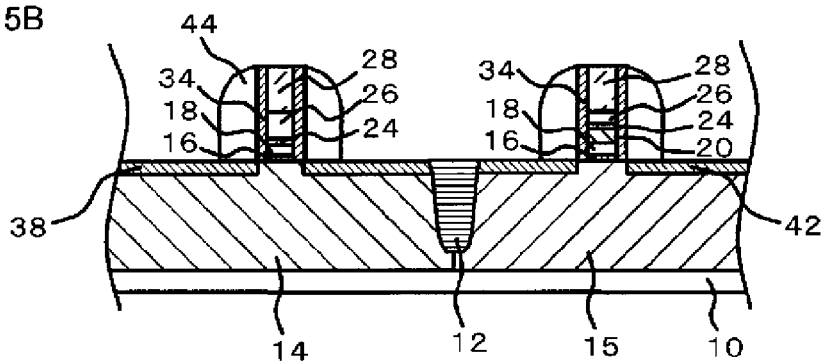

Next, a silicon nitride film or a silicon oxide film is formed, and then processed by dry etching to thereby form sidewall spacers 44 as illustrated in FIG. 5B.

Figure 5C:
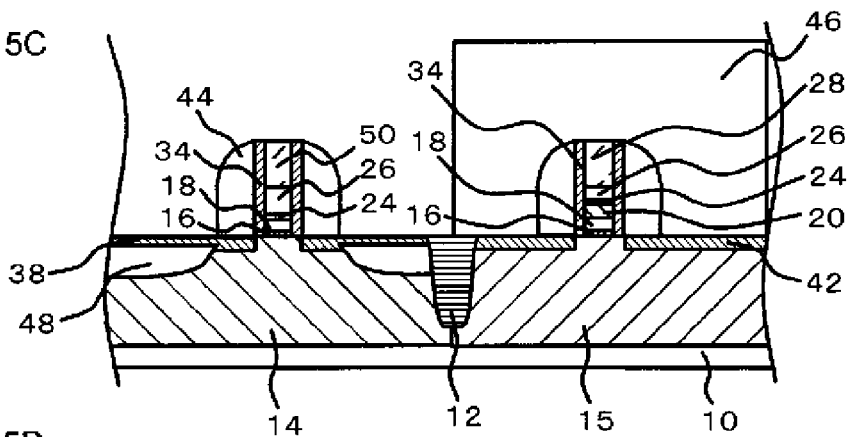

Deep SD regions 48 are then formed by ion implantation in the N-channel MOSFET forming region, while masking the P-channel MOSFET forming region with a resist mask 46 (FIG. 5C). Conditions for the implantation include an ion species of As, an acceleration energy of 20 keV, a dose of 3E15 atoms/cm$^2$, an angle of implantation of 0°; and, an ion species of P, an acceleration energy of 20 keV, a dose of 5E13 atoms/cm$^2$, and an angle of implantation of 0°. In this process, ions are implanted also into the silicon electrode 28, and thereby the N-type silicon electrode 50 is formed.

Figure 5D:
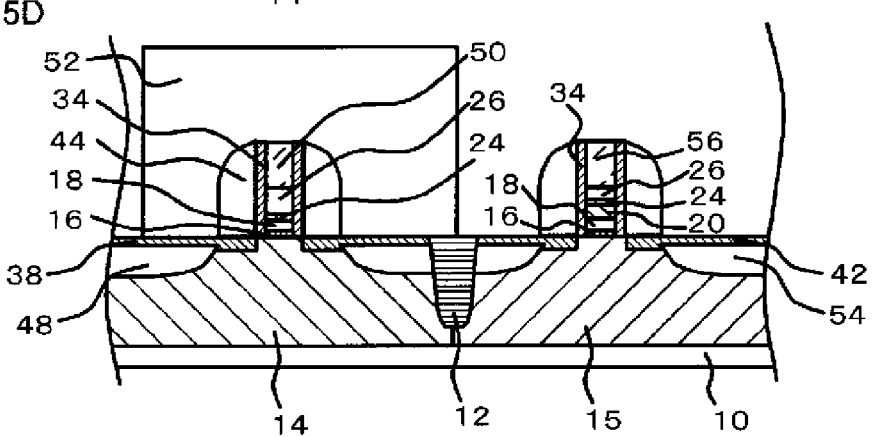

Next, deep SD regions 54 are formed by ion implantation in the P-channel MOSFET forming region, while similarly masking the N-channel MOSFET forming region with a resist mask 52 (FIG. 5D). Conditions for the implantation include an ion species of B, an acceleration energy of 7 keV, a dose of 5.0E13 atoms/cm$^2$, an angle of implantation of 0°; and, an ion species of $BF_2$, an acceleration energy of 9 keV, a dose of 2E15 atoms/cm$^2$, and an angle of implantation of 0°. In this process, ion is implanted also into the silicon electrode 28, and thereby the P-type silicon electrode 56 is formed.

Then the resist mask is removed, and the extension regions and the deep SD regions are activated by annealing. The annealing was carried out typically at 1050° C. for 0 seconds.

Figure 6A:
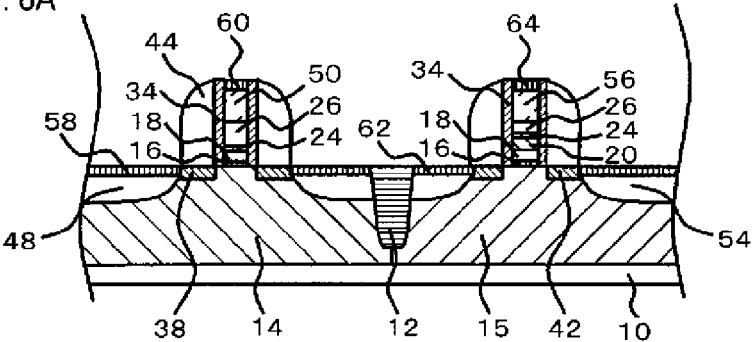

Then as illustrated in FIG. 6A, silicide films 58, 60, 62, 64 are formed. The silicide films may be formed by the method described below. First, an NiPt alloy film of approximately 8 nm thick is formed by sputtering. Pt content of the NiPt alloy film is approximately 5%. The product is then annealed at 375° C., to thereby form primary silicide layers. Portions of the NiPt film remained unreacted are then removed using aqua regia, so as to expose the surface of the primary silicide films. The product is then annealed at 500° C. so as to form secondary silicide films. Silicide films 58, 60, 62, 64 are formed in this way (FIG. 6A). Besides NiPtSi, also NiSi and PtSi can be used for the silicide films.

Figure 6B:
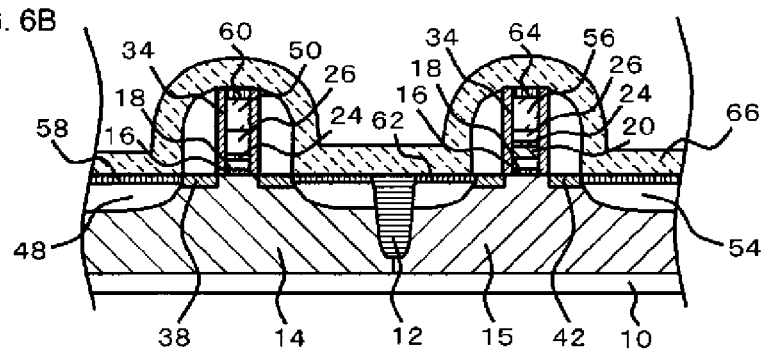
Figure 6C:
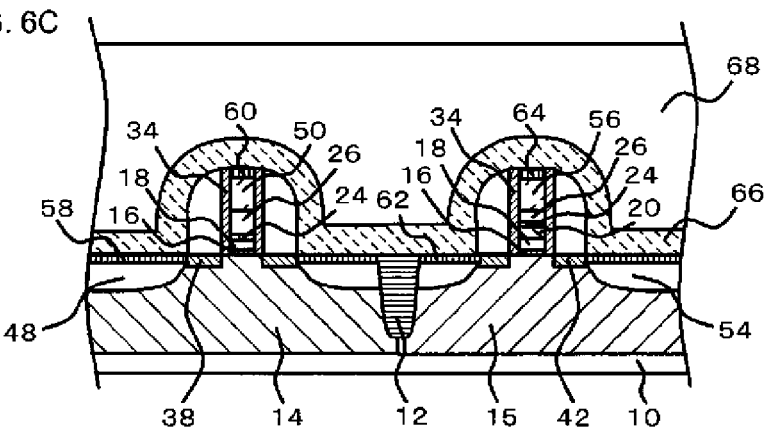
Figure 6D:
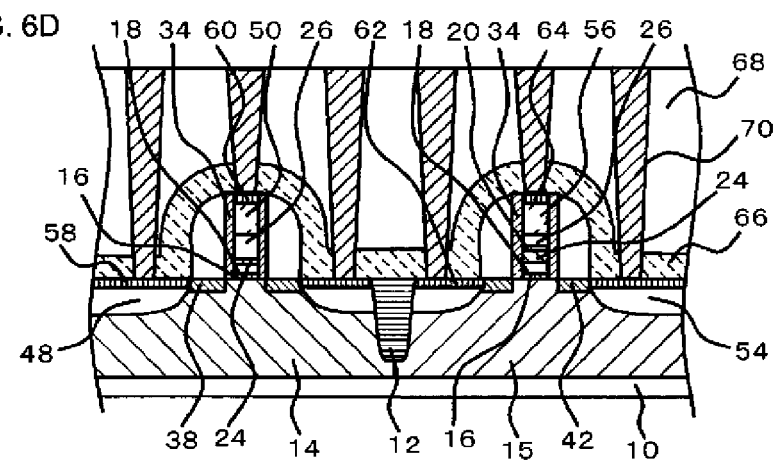

Next, as illustrated in FIG. 6B, a contact etching stopper film 66 is formed. Film species to be used in the present invention may be silicon nitride film, for example. The thickness of the film may be not less than 10 nm but not more than 100 nm, for example. An insulating interlayer 68 composed of a silicon oxide film is then formed as illustrated in FIG. 6C, and contacts 70 are formed as illustrated in FIG. 6D. The semiconductor device 1 illustrated in FIG. 1 may be manufactured in this way.

Effects and operations of this embodiment will be explained below.

In the semiconductor device of the above-described embodiment, the metal oxide film 24 (metal oxide) is interposed between the metal gate electrode 20 (first metal gate electrode) and the metal gate electrode 26 (second metal gate electrode) in the P-channel MOSFET. The metal oxide has a standard enthalpy of formation lower than those of silicon oxide and metal nitride, and is therefore thermally stable. Accordingly, the metal oxide film 24 may be prevented from chemically reacting with the upper and lower metal gate electrodes, and can prevent the metal atom composing the second metal gate electrode from diffusing into the first metal gate electrode layer. Now, the work function of MOSFET which has the metal gate electrode may fully be controllable, and thereby an excellent effect of suppressing the threshold voltage from fluctuating may be obtained. As a consequence, the semiconductor device excellent in controllability of the threshold voltage may be obtained.

Now, specific values of standard enthalpy of formation (occasionally abbreviated as "H" [kJ/mol], hereinafter) will be compared. Values of the standard enthalpy of formation are cited from "Kagaku Binran Kisohen (Handbook of Chemistry, Basic Course)", Revised edition 5, published by Maruzen Co., Ltd., edited by the Chemical Society of Japan.

The standard enthalpy of formation of the Metal oxide (metal oxide film 24) is −1793.7 kJ/mol for $La_2O_3$, −1675.7 kJ/mol for $Al_2O_3$, −2046 kJ/mol for $Ta_2O_5$, −1100.56 kJ/mol for $ZrO_2$, and −1144.7 kJ/mol for $HfO_2$. On the other hand, the standard enthalpy of formation of $SiO_2$, which is an oxide of silicon, is −910.94 kJ/mol. It is obvious that metal oxide is more stable than silicon oxide. In addition, since metal oxide has a standard enthalpy of formation lower than that of metal nitride, as described in the cited publication, so that metal oxide represented by $Al_2O_3$ and so forth is more stable as compared with metal nitride.

In general, a larger absolute value of the standard enthalpy of formation on the negative side represents less reducibility of oxide.

The present inventors, however, found out that the absolute value of H on the negative side, only as large as the values of silicon oxide and metal nitride, is still insufficient, since silicon oxide and metal nitride may be reductively decomposed in the gate electrode in the technical field of MOSFET.

In contrast in the present invention, the standard enthalpy of formation of the metal oxide may be adjustable to −1000 kJ/mol or lower, the absolute value of which on the negative side is larger than H of silicon oxide and metal nitride. If H is −1000 kJ/mol or lower, the metal oxide may hardly be reducible, and may therefore be improved in stability against heat, in this technical field. The metal oxide may therefore be less likely to chemically react with other metal film or the like. The metal oxide may also be thermally stable, and may become less likely to have oxygen vacancy formed therein. As a consequence, metal atoms may be suppressed from diffusing through the metal oxide (metal oxide film 24).

From the viewpoint of making the metal oxide particularly less reducible, the standard enthalpy of formation of the metal oxide per oxygen atom in the present invention may be adjustable to −500 kJ/mol or lower.

Next, effects of this embodiment will be explained, in comparison with the invention described in Japanese Laid-Open Patent Publication No. 2007-208260.

For an exemplary case where a gate electrode structure, having a TiN film, a $SiO_2$ film, and a TiN film stacked therein, is adopted (the configuration described in the cited patent publication), $SiO_2$ may readily be decomposed than the metal oxide is, and may chemically be converted into $TiO_2$, as supposed based on the standard enthalpy of formation. The work function may therefore be controllable only to an insufficient degree, and the threshold voltage may fluctuate.

In addition in the gate electrode structure, having Al, $SiO_2$ and TiN stacked on the gate insulating film (the configuration described in the cited patent publication), it may be supposed based on the standard enthalpy of formation that Ti in the upper layer may punch through $SiO_2$ to readily diffuse into Al. The work function may therefore be controllable only to an insufficient degree, and the threshold voltage may fluctuate.

In contrast in this embodiment, the N-channel MOSFET has the metal oxide film 24 composed of $La_2O_3$, provided between the high-k film 18 composed of $HfO_2$ and the metal gate electrode 26 composed of TiN. By virtue of this configuration, the threshold voltage may be controllable also in the N-channel MOSFET. In other words, the threshold voltage may be controllable in a stable manner both in the P-channel MOSFET and the N-channel MOSFET. Similar effects were obtained also when $Al_2O_3$, $Ta_2O_5$, $ZrO_2$ and $HfO_2$ were used in place of $La_2O_3$, as the metal oxide film 24.

The semiconductor device of the present invention is not limited to the embodiment described in the above, and allows various modifications.

For example, the materials composing the metal gate electrode 20 and the metal gate electrode 26 of the P-channel MOSFET, which were different from each other in the embodiment described in the above, may alternatively be same.

It is apparent that the present invention is not limited to the above embodiment, that may be modified and changed without departing from the scope and spirit of the invention.

What is claimed is:

1. A semiconductor device having a semiconductor substrate and a first-conductivity-type-channel MOSFET formed thereon, comprising:
   a first gate insulating film provided over said semiconductor substrate;
   a first metal gate electrode provided over said first gate insulating film;
   a metal oxide film provided over said first metal gate electrode;
   a second metal gate electrode provided over said metal oxide film; and
   a second-conductivity-type-channel MOSFET provided on said semiconductor substrate, wherein said second-conductivity-type-channel MOSFET comprises a second gate insulating film provided over said semiconductor substrate and a third metal gate electrode provided over said second gate insulating film.

2. The semiconductor device according to claim 1, wherein said second-conductivity-type-channel MOSFET further comprises a metal oxide film provided between said second gate insulating film and said third metal gate electrode.

3. The semiconductor device according to claim 1, wherein said metal oxide film comprises at least one selected from the group consisting of $La_2O_3$, $Al_2O_3$, $Ta_2O_5$, $ZrO_2$ and $HfO_2$.

4. The semiconductor device according to claim 1, wherein said metal oxide film has a thickness of not less than 0.1 nm but not more than 10.0 nm.

5. The semiconductor device according to claim 1, wherein said first metal gate electrode comprises at least one selected from the group consisting of Al, TiN, W, TaN, TaSiN, Ru and TiAl.

6. The semiconductor device according to claim 1, wherein said second metal gate electrode comprises at least one selected from the group consisting of TiN, W, TaN, TaSiN, Ru, TiAl and Al.

7. The semiconductor device according to claim 1, wherein said third metal gate electrode contains at least one species selected from the group consisting of TiN, W, TaN, TaSiN, Ru, TiAl and Al.

8. The semiconductor device according to claim 1, wherein said first-conductivity-type-channel MOSFET is a P-channel MOSFET.

9. The semiconductor device according to claim 1, wherein said second-conductivity-type-channel MOSFET is an N-channel MOSFET.

10. A method of manufacturing a semiconductor device comprising:
    forming a first gate insulating film over a semiconductor substrate;
    forming a first metal gate electrode layer over said first gate insulating film;
    forming a metal oxide film over said first gate electrode layer;
    forming a second metal gate electrode layer over said metal oxide film;
    forming a second gate insulating film over said substrate;
    forming a third metal gate electrode over said second gate insulating film; and
    forming a second-conductivity-type-channel MOSFET on said semiconductor substrate that comprises said second gate insulating film and said third metal gate electrode.

11. The method of manufacturing a semiconductor device according to claim 10, wherein said metal oxide film comprises at least one selected from the group consisting of $La_2O_3$, $Al_2O_3$, $Ta_2O_5$, $ZrO_2$ and $HfO_2$.

12. The method of manufacturing a semiconductor device according to claim 10, wherein said metal oxide film has a thickness of not less than 0.1 but not more than 10.0 nm.

13. The method of manufacturing a semiconductor device according to claim 10, wherein said first metal gate electrode layer comprises at least one selected from the group consisting of Al, TiN, W, TaN, TaSiN, Ru and TiAl.

14. The method of manufacturing a semiconductor device according to claim 10, wherein said second metal gate electrode comprises at least one selected from the group consisting of TiN, W, TaN, TaSiN, Ru, TiAl and Al.

15. A method of manufacturing a semiconductor device having a semiconductor substrate, and a first-conductivity-type-channel MOSFET and a second-conductivity-type-channel MOSFET provided on said semiconductor substrate, said method comprising:
    forming a first gate insulating film and a second gate insulating film over said semiconductor substrate in a first-conductivity-type-channel MOSFET forming region and a second-conductivity-type-channel MOSFET forming region, respectively;
    forming a first metal gate electrode layer over said first gate insulating film;
    forming a metal oxide film respectively over said first metal gate electrode layer and said second gate insulating film; and
    forming a second metal gate electrode film over said metal oxide film in said first-conductivity-type-channel MOSFET forming region, and forming a third metal gate electrode film over said metal oxide film in said second-conductivity-type-channel MOSFET forming region.

16. The method of manufacturing a semiconductor device according to claim 15, wherein said metal oxide film comprises at least one selected from the group consisting of $La_2O_3$, $Al_2O_3$, $Ta_2O_5$, $ZrO_2$ and $HfO_2$.

17. The method of manufacturing a semiconductor device according to claim 15, wherein said metal oxide film has a thickness of not less than 0.1 but not more than 10.0 nm.

18. The method of manufacturing a semiconductor device according to claim 15, wherein said first metal gate electrode layer comprises at least one selected from the group consisting of Al, TiN, W, TaN, TaSiN, Ru and TiAl.

19. The method of manufacturing a semiconductor device according to claim 15, wherein said second metal gate electrode comprises at least one selected from the group consisting of TiN, W, TaN, TaSiN, Ru, TiAl and Al.

20. The method of manufacturing a semiconductor device according to claim 15, wherein said third metal gate electrode comprises at least one selected from the group consisting of TiN, W, TaN, TaSiN, Ru, TiAl and Al.

21. The method of manufacturing a semiconductor device according to claim 15, wherein said first-conductivity-type-channel MOSFET is a P-channel MOSFET.

22. The method of manufacturing a semiconductor device according to claim 15, wherein said second-conductivity-type-channel MOSFET is an N-channel MOSFET.

* * * * *